US008135563B2

United States Patent
Srinivasan et al.

(10) Patent No.: US 8,135,563 B2
(45) Date of Patent: Mar. 13, 2012

(54) APPARATUS AND METHOD FOR EVALUATING THE PERFORMANCE OF SYSTEMS HAVING TIME-VARYING OUTPUT CHARACTERISTICS

(75) Inventors: Ganesh Parasuram Srinivasan, Richardson, TX (US); Friedrich Johannes Taenzler, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 772 days.

(21) Appl. No.: 12/241,479

(22) Filed: Sep. 30, 2008

(65) Prior Publication Data

US 2010/0082278 A1   Apr. 1, 2010

(51) Int. Cl.
*G06F 11/00* (2006.01)
*G06F 17/00* (2006.01)
(52) U.S. Cl. ......... 702/182; 702/183; 702/179; 324/605
(58) Field of Classification Search .................. 702/182, 702/179, 183
See application file for complete search history.

(56) References Cited

U.S. PATENT DOCUMENTS

| | | | |
|---|---|---|---|
| 4,688,234 A * | 8/1987 | Robinton | 375/227 |
| 6,374,084 B1 | 4/2002 | Fok | |
| 6,615,164 B1 | 9/2003 | Gopisetty | |
| 6,934,646 B2 * | 8/2005 | Montijo | 702/66 |
| 7,386,041 B2 * | 6/2008 | Nygaard, Jr. | 375/224 |
| 7,483,477 B2 * | 1/2009 | Nygaard, Jr. | 375/224 |
| 2004/0064299 A1 * | 4/2004 | Mark et al. | 703/13 |

* cited by examiner

*Primary Examiner* — Hal Wachsman
(74) *Attorney, Agent, or Firm* — Steven A. Shaw; W. James Brady; Frederick J. Telecky, Jr.

(57) ABSTRACT

An apparatus for evaluating a system. The apparatus can include a storage element for receiving at least one time-varying output characteristic of the system, the time-varying output characteristic comprising a plurality of raw data points representing a plurality of measurements at a plurality of times; and a processing element communicatively coupled to the storage element. The processing element can be configured for partitioning the plurality of raw data points into a plurality of segments, calculating a plurality of estimated data points based on a plurality of mathematical expressions, and characterizing the system based on at least one figure of merit (FOM) computed from the plurality of estimated data points. In the apparatus, at least one of the plurality of mathematical expressions is associated with each of the plurality of segments.

21 Claims, 4 Drawing Sheets

APPARATUS AND METHOD FOR EVALUATING THE PERFORMANCE OF SYSTEMS HAVING TIME-VARYING OUTPUT CHARACTERISTICS

FIELD OF THE INVENTION

The present invention relates to evaluating performance of systems, and more specifically to apparatus and methods for evaluating performance of systems that have time-varying output characteristics.

BACKGROUND

A figure of merit (FOM) is a quantity typically used to characterize the performance of a device relative to other devices of the same type. In engineering, FOMs are often defined for a particular system, including materials, devices, or processes, in order to determine their relative utility for an application. In commerce, FOMs are often used as a marketing tool to convince consumers to choose a particular brand. FOMs are typically calculated based on one or more output characteristics of the system being evaluated. For example, in the specific case of a wireless power amplifier in a wireless electronic device, droop, the intentional loss in output voltage from the device as it drives a load, is commonly used as an FOM and is calculated from the output characteristics of the wireless device.

Time-varying output characteristics are obtained by performing multiple measurements of the system in question at various times. Typically, such measurements include at least a minimum amount of signal noise from various sources, resulting in variations in the output characteristic obtained. For example, in the case of electrical measurements for an electronic device, an output characteristic may exhibit shot noise, thermal noise, flicker (1/f) noise, burst noise, avalanche noise, and/or noise induced by environmental factors. Accordingly, such variations in the output characteristics of the electronic device can result in inaccurate FOM values. In some cases, the amount of measurement noise can mask the behavior of the output characteristic entirely, resulting in measurements and associated FOMs being of little or no utility. As a result, there have been considerable efforts made to reduce and/our counter the effects of different noise sources in test equipment. For example, some types of high accuracy electronic test equipment include additional hardware features specifically configured to counter particular noise sources to minimize the introduction of noise into the output characteristic used for calculating the FOM. In some cases, the electronic test equipment includes a regression analysis system for generating a model for the data points. Such regression analysis systems are typically configured to generate a mathematical function that models the output response.

SUMMARY

This Summary is provided to comply with 37 C.F.R. §1.73, presenting a summary of the invention to briefly indicate the nature and substance of the invention. It is submitted with the understanding that it will not be used to interpret or limit the scope or meaning of the claims.

As described above, a FOM may be dependent on the accuracy of the test equipment being used. However, regardless of the accuracy of the test equipment, elimination of substantially all sources of noise during a measurement is typically difficult to achieve. As a result, even when high accuracy, and typically costly, test equipment is employed for obtaining an output characteristic, sufficient variation due to noise may still be present in the signal to result in an incorrectly computed FOM. Furthermore even when regression techniques are utilized in conjunction with such test equipment, some types of output characteristics cannot be accurately modeled by the generated curve. As a result, incorporating high accuracy test equipment may increase costs without significantly improving the ability to obtain an accurate FOM. Even worse, as the range of acceptable FOM values is narrowed for some systems, measurement noise will result in measurements of little or no utility even when utilizing high accuracy test equipment.

In response to these problems, embodiments of the present invention provide for evaluating a system based on calculating a FOM for the system based on a piecewise estimate of a time-varying output characteristic of the system. In particular, the Present Inventors have discovered that by segmenting the time-varying output characteristic and independently generating mathematical expressions for describing the data points in each segment, an estimated set of reduced noise data points can be obtained for more accurately calculating the FOM. That is, the mathematical expressions can be used to obtain a smoothened output characteristic that is localized for each of the various segments, allowing FOMs associated with yield to be evaluated on relatively low accuracy test equipment or in relatively close proximity to sources of signal noise.

In the various embodiments of the present invention, methods for evaluating a system, including electronic devices, and apparatus for implementing such methods are provided. An exemplary method can include collecting at least one time-varying output characteristic of the system, where the output characteristic includes a plurality of raw data points, and partitioning the plurality of raw data points into a plurality of segments. The method can also include calculating a plurality of estimated data points based on a plurality of mathematical expressions associated with each of the segments and characterizing the system based on at least one FOM for at least one parameter computed from the plurality of estimated data points. In embodiments where an electronic device is evaluated, exemplary parameters the method can compute include droop, overshoot, rise time, fall time, pulse duration, undershoot, and/or device output power linearity from the plurality of estimated data points.

In some embodiments of the present invention, the mathematical expressions can be polynomial equations. The polynomial equations can be arbitrary or can be based on first principles. Furthermore, the polynomial equation for each segment can be iteratively adjusted to improve matching in each segment. That is, a candidate polynomial equation can be automatically selected and adjusted until some amount of matching exists between the data points generated by the candidate polynomial equation and the raw data points in the segment. During each of the iterations, a value of the coefficients and/or the order of the candidate polynomial equation can be adjusted.

DETAILED DESCRIPTION

The various embodiments of the present invention are described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The various embodiments of the present invention are not limited by the illustrated ordering of acts or events, as some acts may occur in different orders and/or concurrently with other acts or events. Furthermore, not all illustrated acts or events are required to implement a methodology in accordance with the present invention.

Many systems are evaluated based on one or more figures-of-merit (FOM) obtained from one or more output characteristics. Exemplary FOMs used for categorizing physical systems include the clock rate of a CPU, contrast ratio of an LCD display, or the frequency response of a speaker. A "system", when referred to herein as being evaluated, refers collectively to objects, devices, processes, or any combination thereof, being evaluated and compared to one or more criteria. FOMs are of particular importance when binning or categorizing different systems, as a manufacturer can mark up systems with increased performance to improve profit margins. For example, in the case of evaluating a system, such as CPU formed from an integrated circuit, the clock rate can be used to categorize the integrated circuit into different speed bins. As a result, the manufacturer can command a higher price for those integrated circuits falling into the faster bin(s) as opposed to those in the slower bin(s). As previously described, an important aspect of the evaluation process is obtaining an output characteristic of the system that will allow the FOM to be accurately calculated. That is, an output characteristic having relatively little measurement noise. Accordingly, various noise cancelling and or countering techniques are conventionally used for generating the output characteristics utilized for calculating FOMs.

The present Inventors, however, have discovered that by segmenting or partitioning the output characteristic into segments and generating sufficiently accurate mathematical expressions for describing the data points in each segment, an estimated set of reduced noise data points can be obtained that allows an FOM to be more accurately calculated without the need for some, if not all, the noise cancelling techniques typically used for obtaining time-varying output characteristics. That is, the mathematical expressions can be used to produce a smoothened version of the output characteristic to remove a least a portion of the measurement noise, without obscuring the underlying device output characteristic. This allows FOMs to be more accurately evaluated, such as on relatively low accuracy test equipment or in relatively close significant proximity to sources of signal noise.

Although the exemplary embodiments will be described in terms of measurement of a time-varying output signal responsive to a time-varying input signal during a measurement period, the various embodiments of the present invention are not limited in this regard. The various embodiments of the present invention can be utilized for calculating any type of FOM based on any type of input signal or parameter, which can be fixed or time-varying. That is, FOMs can be calculated based on measurements performed during any type of measurement sweep. Accordingly, the various embodiments of the present invention are equally applicable to the calculating of FOMs from frequency sweeps, indexed value or function-based sweeps, and time sweeps, to name a few.

Although the present invention will be described with respect to a few exemplary embodiments, the present invention can be embodied in many different forms and should not be construed as limited to the embodiments set forth herein. For example, the present invention can be embodied as a method, an apparatus, or a computer program product. Accordingly, the present invention can take the form as an entirely hardware embodiment, an entirely software embodiment or a hardware/software embodiment.

Figure 1:
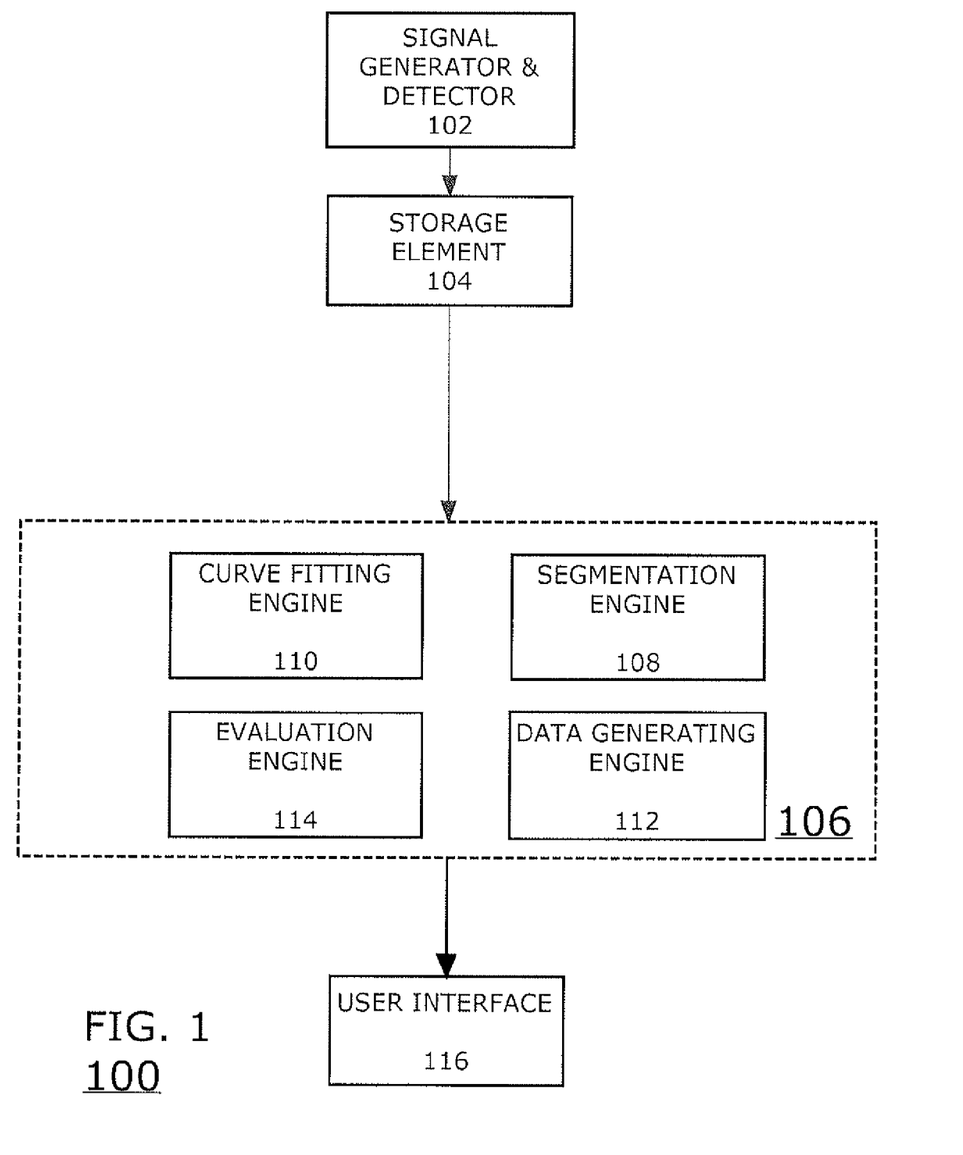
FIG. 1 depicts a block diagram of an exemplary apparatus for evaluating performance of a system according to an embodiment of the present invention.

FIG. 1 depicts a block diagram of an exemplary apparatus 100 for evaluating performance of a system according to an embodiment of the present invention. For example, in one embodiment the apparatus 100 can be utilized to evaluate performance of power amplifier in a wireless electronic device, such as an integrated circuit die or packaged device. Therefore, the apparatus 100 can be used to obtain a time-varying signal generated by the power amplifier, compute a FOM, such as droop, and determine how to categorize or bin the die or the packaged device based on the computed FOM.

The apparatus 100 includes signal generator and detector (SGD) 102 for retrieving data from the system of interest. For example, in the case of a wireless electronic device, the SGD 102 can be an electrical parameter extractor generating one or inputs for the wireless electronic device and collecting the time-varying response of the wireless electronic device as the time-varying output characteristic. The SGD 102 can be communicatively coupled to a storage element 104 for storing the raw data associated with the time-varying output characteristic obtained by the SGD 102.

The apparatus can further include a processing element 106 communicatively coupled to the storage element 104. The processing element 106 can include a segmentation engine 108, a curve fitting engine 110, a data generating engine 112, and an evaluation engine 114. The segmentation engine 108 can be configured for partitioning or segmenting the output characteristic stored in the storage element 104. The segmentation engine 108 can segment the data by indentifying at least segmentation point in the output characteristic. For example, the segmentation engine 108 can identify segmentation points based on rates of change in the raw data values. Alternatively, the segmentation engine 108 can indentify segments based on pre-defined time divisions. However, the various embodiments of the present invention are not limited to the segmentation techniques described above. In the various embodiments of the present invention, any type of segmentation technique can be used by the segmentation engine 108 to produce at least two segments.

The curve fitting engine 110 can be configured to automatically determine a mathematical expression for each of the plurality of segments identified by the segmentation engine 108. In some embodiments, the curve fitting engine 10 can be configured to provide polynomial equations for each segment. That is, equations of the form:

$$f(x) = a_n x^n + a_{n-1} x^{n-1} + \ldots + a_2 x^2 + a_1 x + a_0.$$

Polynomial equations are advantageous for curve fitting such equations can be easily adapted to approximate many types of behaviors, include linear, exponential, or even oscillatory behaviors. In some embodiments, the curve fitting engine can be configured to implement a least squares fit method for computing the coefficients of the polynomial. Alternatively, a candidate polynomial can be provided, based on first principles or empirical data describing system behavior, and the curve fitting engine 110 can be configured to iteratively determine a form of a polynomial equation best matching the raw data in the segment. Although the curve fitting engine 110 has been described with respect to obtaining polynomial equations, the various embodiments of the present invention are not limited in this regard. In the various embodiments of the present invention, the curve fitting engine 110 can be configured to perform curve fitting using any other type of curve fitting techniques and various types of mathematical expressions. For example, the curve fitting engine 10 can generate curves based on power functions, exponential function, logarithmic functions, linear functions. The curve fitting engine 110 can also generate curves based on a moving average analysis, a regression analysis, and spline-based methods. However, the various embodiments of the present invention are not limited solely to these methods and any other method suitable for fitting data in a segment can be used in the various embodiments of the present invention. In some embodiments, different curve fitting techniques or different types of mathematical expressions can be utilized for different segments. Such a configuration can be advantageous, since the behavior in different segments can vary be different and a more accurate result can be provided for a particular segment by implementing a particular technique.

Although the various components in FIG. 1 are shown and described as separate components, operatively and physically, the various embodiments of the present invention are not limited in this regard. In some embodiments of the present invention, two or more of the various components can be combined into a single component performing the various functions described above. For example, in the case of testing an integrated circuit or other electrical device, the apparatus 100 can comprise a single electrical parameter extractor/analyzer capable of generating electrical input signals, recording electrically output signals, and generating and evaluating FOMs according to one or more methods described herein. Additionally, one or more of the components described above can be implemented in a localized or distributed fashion. For example, SOD 102 and user interface (UI) 116 can operate locally, while storage element 104 and processing element 106 can be configured to operate at local or remote locations in one or more computing systems.

Figure 2:
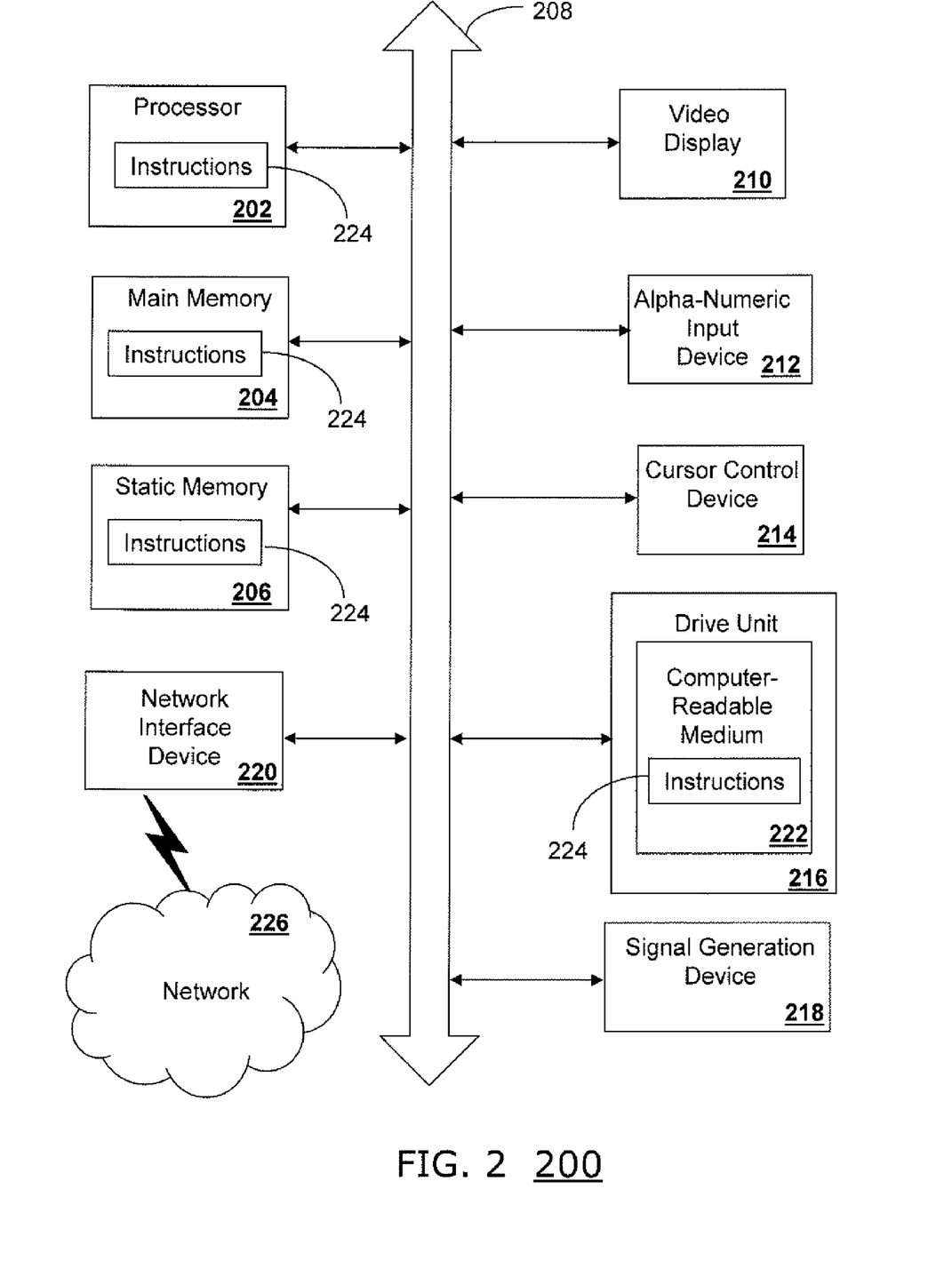
FIG. 2 is an exemplary computer system that can be employed to implement one or more methods according to the various embodiments of the present invention.

The various embodiments of the present invention can take the form as an entirely hardware embodiment, an entirely software embodiment, or any combination thereof. However, the invention is not limited in this regard and can be implemented in many other forms not described herein. For example, FIG. 2 is a schematic diagram of an embodiment of a computer system 200 for executing a set of instructions that, when executed, causes the computer system 200 to perform one or more of the methodologies and procedures described herein. In some embodiments, the computer system 200 operates as a standalone device. In other embodiments, the computer system 200 is connected (e.g., using a network) to other computing devices. In a networked deployment, the computer system 200 operates in the capacity of a server or a client developer machine in server-client developer network environment, or as a peer machine in a peer-to-peer (or distributed) network environment.

In the some embodiments, the computer system 200 can comprise various types of computing systems and devices, including a server computer, a client user computer, a personal computer (PC), a tablet PC, a laptop computer, a desktop computer, a control system, a network router, switch or bridge, or any other device operable for executing a set of instructions (sequential or otherwise) that specifies actions to be taken by that device. It is to be understood that a device of the present disclosure also includes any electronic device that provides voice, video or data communication. Further, while a single computer is illustrated, the phrase "computer system" shall be understood to include any collection of computing devices that individually or jointly execute a set (or multiple sets) of instructions to perform any one or more of the methodologies discussed herein.

The computer system 200 can include a processor 202 (such as a central processing unit (CPU), a graphics processing unit (GPU, or both), a main memory 204 and a static memory 206, which communicate with each other via a bus 208. The computer system 200 can further include a display unit 210, such as a video display (e.g., a liquid crystal display or LCD), a flat panel, a solid state display, or a cathode ray tube (CRT)). The computer system can also include an alpha-numeric input device 212 (e.g., a keyboard), a cursor control device 214 (e.g., a mouse), a disk drive unit 216, a signal generation device 218 (e.g., a speaker or remote control) and a network interface device 220.

The disk drive unit 216 includes a computer-readable medium 222 on which is stored one or more sets of instructions 224 (e.g., software code) configured to implement one or more of the methodologies, procedures, or functions described herein. The instructions 224 reside, completely or at least partially, within the main memory 204, the static memory 206, and/or within the processor 202 during execution thereof by the computer system 200. The main memory 204 and the processor 202 also can constitute machine-readable media.

Those skilled in the art will appreciate that the computer system architecture illustrated in FIG. 2 is one possible example of a computer system. However, the invention is not limited in this regard and any other suitable computer system architecture can also be used without limitation.

For example, dedicated hardware implementations including, but not limited to, application-specific integrated circuits, programmable logic arrays, and other hardware devices can likewise be constructed to implement the methods described herein. Applications that can include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the exemplary system is applicable to software, firmware, and hardware implementations.

In accordance with various embodiments of the present invention, the methods described below can be stored as software programs in a computer-readable medium and can be configured for running on a computer processor. Furthermore, software implementations can include, but are not limited to, distributed processing, component/object distributed processing, parallel processing, virtual machine processing, which can also be constructed to implement the methods described herein.

Therefore, in some embodiments of the present invention, the various embodiments of the present invention are embodied as a computer-readable medium containing instructions 224 or that receives and executes instructions 224 from a propagated signal so that a device connected to a network environment 226 sends or receive voice and/or video data and that communicate over the network 226 using the instructions 224. The instructions 224 are further transmitted or received over a network 226 via the network interface device 220.

While the computer-readable medium 222 is shown in an exemplary embodiment to be a single storage medium, the term "computer-readable medium" should be taken to include a single medium or multiple media (e.g., a centralized or distributed database, and/or associated caches and servers) that store the one or more sets of instructions. The term "computer-readable medium" shall also be taken to include any non-volatile tangible medium that is operable for storing, encoding or carrying a set of instructions for execution by the machine and that cause the machine to perform any one or more of the methodologies of the present disclosure.

The term "computer-readable medium" shall accordingly be taken to include, but not be limited to, solid-state memories such as a memory card or other package that houses one or more read-only (non-volatile) memories, random access memories, or other re-writable (volatile) memories; magneto-optical or optical medium such as a disk or tape; as well as carrier wave signals such as a signal embodying computer instructions in a transmission medium; and/or a digital file attachment to e-mail or other self-contained information archive or set of archives considered to be a distribution medium equivalent to a tangible storage medium. Accordingly, the disclosure is considered to include any one or more of a computer-readable medium or a distribution medium, as listed herein and to include recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, and HTTP) represent examples of the state of the art. Such standards are periodically superseded by faster or more efficient equivalents having essentially the same functions. Accordingly, replacement standards and protocols having the same functions are considered equivalents.

Figure 3A:
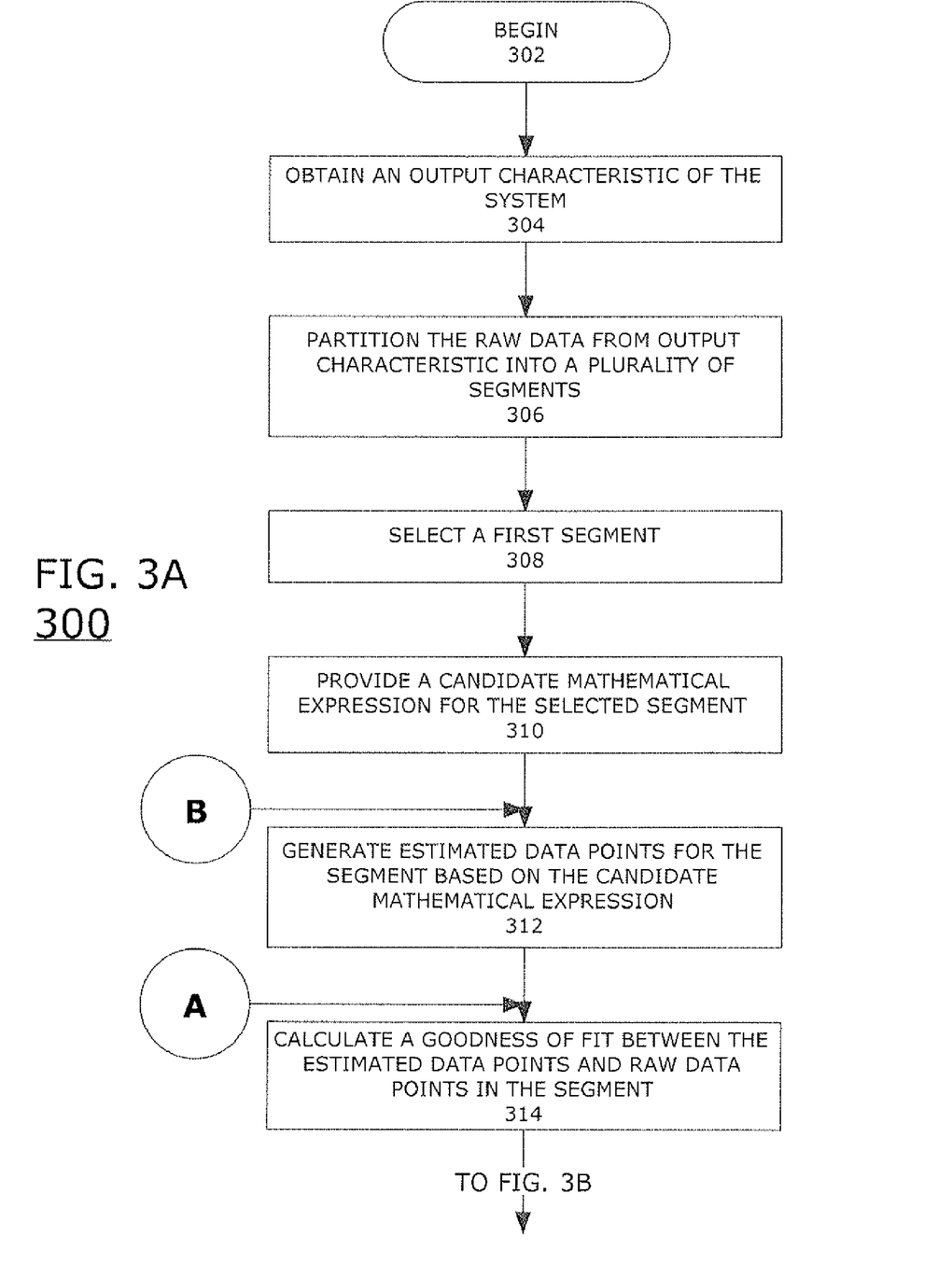
FIGS. 3A and 3B depict a flow diagram depicting an exemplary method for evaluating performance of a system according to an embodiment of the present invention.
Figure 3B:
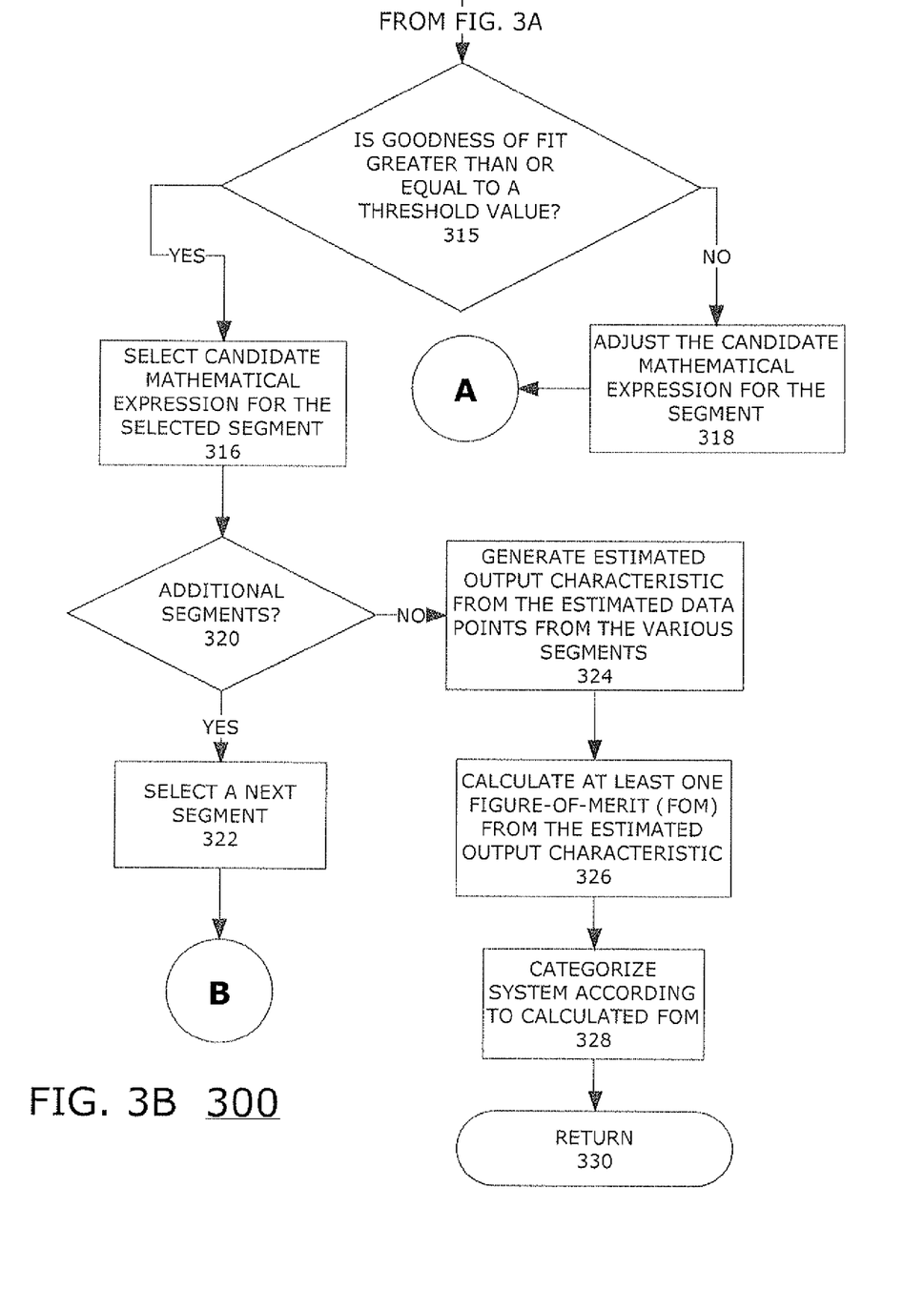

FIGS. 3A and 3B show a flow diagram depicting an exemplary method 300 for evaluating performance of a system according to an embodiment of the present invention. The method 300 begins at step 302 and continues to step 304. In step 304, at least one output characteristic is obtained for the system being tested. Afterwards, in step 306, the output characteristic obtained in step 304 is partitioned or segmented into a plurality of segments.

Although the output characteristic can generally be segmented in any way, in some embodiments of the present invention, the output characteristic can be divided into segments to facilitate subsequent curve fitting processes. As previously described, the output characteristic can be segmented by identifying the location of one or more segmentation points in the time-varying output characteristic. For example, in some embodiments of the present invention, segmentation points can be identified from discontinuities in the output characteristic obtained in step 304. Such discontinuities can be found by analyzing the rate of change in the raw data and segmenting when a location in the output characteristic is found to have a rate of change at some point in the output characteristic that exceeds a threshold amount. For example, in a droop calculation, the initial portion of the output characteristic typically require a higher-order of polynomial due to their unsettled nature and the later portion requires lower-order polynomials as the response is almost flat in these segments. Accordingly, if the FOM is pre-determined to be a droop measurement, a greater rate of change can be allowed in an initial portion before segmenting as compared to later segments. However, the rate of change information is not limited to solely for discovering discontinuities in the raw data. In other embodiments, rate of change information can be used to find transitions between a first function type and a second function type. For example, for an output characteristic representing an electrical pulse, a first portion of the pulse, associated with a change in voltage, current, or load, typically exhibits a short-lived oscillation or transient. Afterwards, the second portion of the pulse typically exhibits constant magnitude or constant change in magnitude. Accordingly, in step 306, a segmentation point can be selected based on overall differences between rates of change for groups of data points That is, if an overall difference in rate of change in data between a first group of raw data points and a second group of raw data points exceeds a threshold amount, or vice versa, the groups of raw data points can be associated with different segments.

In some embodiments, the partitioning can be triggered by a previous implementation of method 300. That is, if the results of partitioning and curve fitting during a previous implementation of method 300 resulted in candidate mathematical expressions in which only a poor goodness of fit was obtained, further partitioning can be provided to improve the goodness of fit and improve the accuracy of the FOM. Alternatively, if the complexity of the functions obtained during a previous implementation exceeds an acceptable complexity, further partition can be provided. For example, if polynomial equations are utilized and the order of the resulting equations exceeds a threshold value, further partitioning can be provided to try and obtain a set of less complex polynomials for the different segments.

However, the various embodiments of the present invention are not limited to identifying segments based only on rate of change information. In other embodiments, the segments can be identified based on specified time segments. That is, regardless of the values of raw data points, the output characteristic can be divided into segments according to one or more segmentation points defined by pre-defined time divisions. In some cases, these specified time divisions can be pre-defined by the user before the output characteristic is obtained. In other cases, the specified time divisions can be selected by a user after the output characteristic is obtained.

In still other embodiments, curve fitting methods can also be used to segment the output characteristic. That is, in the case where the types of functions associated with a particular type of output characteristic are well-known or can otherwise be determined a-priori, such as for an electrical pulse, different functions, associated with known types of features in the output characteristic can be compared to the entire output characteristic. The segments can then be identified based on the points in the output characteristic where the different functions appear to at least partially match the output characteristic. For example, in the case of the electrical pulse, an oscillatory function may match a first portion of the raw data points and a linear function may match a second portion of the raw data point. As a result, a segmentation point can be identified where the matching portions of the functions overlap. These methods of segmenting the output characteristic are presented by way of example and not by way of limitation and any other methods can be used in the various embodiments of the present invention.

Once the output characteristic has been partitioned in step 306, a first segment can be selected in step 308 for curve fitting. Afterwards in step 310, a candidate mathematical expression can be selected for the selected segment. As previously described, any mathematical expression can be selected as a candidate expression. However, in some embodiments of the present invention, a candidate polynomial equation can be selected. As previously described, the use of a polynomial equation provides the advantage that by adjusting the order and coefficients of a polynomial equation, functions ranging from linear functions to highly oscillatory functions can be fitted. Furthermore, computationally efficient methods exist for determining the coefficients of such polynomial equations using least squares methods.

Although any mathematical expression can be selected as a candidate expression in step 310, in some embodiments of the present invention, a mathematical expression can be selected based on previously collected data for the system or similar systems. For example, in the case of the electrical pulse described above and previous observations of such pulses, a candidate mathematical expression exhibiting typical oscillatory behavior can be provided for the first portion while a candidate mathematical expression exhibiting essentially linear behavior can be provided for the second portion. Alternatively, candidate mathematical expressions can be selected based on first principles. That is, mathematical expression derived from one or more equations that describe the physical phenomena resulting in the various portions of the output characteristic.

After the candidate mathematical expression is provided or selected in step 310, Estimated data points for the selected segment can be generated based on the candidate mathematical expression in step 312. Subsequently, a goodness of the fit value between estimated data points calculated using the candidate expression and the raw data points can be obtained in step 314. For example, a standard error of regression (SER) and/or the $R^2$ value can be used to evaluate the matching of the fit. After the goodness of fit is calculated in step 314, a determination can be made as to whether additional curve fitting is required prior to evaluation of the system. Accordingly, in step 315, if the goodness of fit is above a pre-defined threshold value, the candidate mathematical expression can be used as a final mathematical expression for the segment in step 316. However, if the goodness of fit is below a pre-defined threshold value, further refinement of the candidate mathematical expression can be performed in step 318. For example in the case of a $R^2$ value, a candidate mathematical expression can be selected for the final mathematical expression if $R^2$ is greater than 0.9, 0.95, or some other predefined value. In some embodiments the goodness of fit threshold value can vary according to the segment.

Refinement of the candidate mathematical expression can be performed in several ways. For example, in some embodiments, the coefficient and/or order values can be adjusted and steps 312-318 can be iteratively repeated until the goodness of fit is at or above the threshold value at step 315. In embodiments where a polynomial equation is selected, an order for the candidate polynomial can be adjusted during each of the iterations and a least squares method can be used to determine the new candidate mathematical expression.

Once a final form for candidate mathematical expression is selected in step 316, the method 300 can process the other segments in the output characteristic. First in step 320, the method can determine if additional segments exist for curve fitting. If another segment exists in step 320, a next segment can be selected in step 322 and the method can repeat beginning with step 310 for the selected segment. The serial processing of the various segments, as shown in FIGS. 3A and 3B, is presented for ease of illustration only and the various embodiments of the present invention are not limited in this regard. In some embodiments, processing of the various segments can be performed in parallel or in a combination of parallel and serial steps.

After the final form for the mathematical expressions for each of the segments is obtained, the method 300 can generate an estimated output characteristic in step 324. That is, the mathematical expressions obtained in step 316 for each segment are used to generate estimated data points for each segment. Accordingly, an estimated output characteristic is obtained by combing the estimated data points from the various segments. As previously described, in the various embodiments of the present invention, rather than using the output characteristic obtained in step 304 to evaluate the system, the estimated data points are used instead to provide an estimated output characteristic for evaluating the system. Based on these estimated data points, at least one FOM for the system can be calculated in step 326. For example, in the case of an electrical pulse, such an FOM can be droop, overshoot, rise time, fall time, pulse duration, and/or undershoot for the pulse, as previously described, based on the estimated output characteristic. After the FOM is calculated, the system is categorized according to the FOM. For example, in the case of an electronic device, the device can be placed in one of a plurality of bins according to a performance measure. Alternatively, the FOM can be used to place the electronic device in accept or reject bins. After the system is categorized in step 328, the method 300 can end in step 330 and resume previous processing.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. A method for evaluating an electronic circuit, the method comprising:
   receiving at least one time-varying output characteristic output signal of said electronic circuit, said at least one time-varying output characteristic comprising a plurality of raw data points representing a plurality of measurements at a plurality of times;
   partitioning said plurality of raw data points into a plurality of segments;
   calculating a plurality of estimated data points based on a plurality of mathematical expressions, wherein at least one of said plurality of mathematical expressions are associated with each of said plurality of segments; and
   characterizing said electronic circuit based on at least one figure of merit (FOM) computed from said plurality of estimated data points.

2. The method of claim 1, wherein said calculating further comprises:
   generating said plurality of mathematical expressions, each of said plurality of mathematical expressions approximating a behavior of said raw data points in an associated segment of said plurality of segments and satisfying a minimum goodness of fit criteria with respect to said plurality of raw data points in said associated segment.

3. The method of claim 2, wherein said generating further comprises:
   selecting a candidate mathematical expression for a selected segment from said plurality of segments;
   computing said plurality of estimated data points for said selected segment using said candidate mathematical expression;
   evaluating a goodness of fit value between said plurality of estimated data points based on said candidate mathematical expression and said plurality of raw data points in said segment;
   if said goodness of fit value fails to satisfy said minimum goodness of fit criteria, adjusting said candidate mathematical expression and repeating said computing and said evaluating; and
   if said goodness of fit value satisfies said minimum goodness of fit criteria, associating said candidate mathematical expression with said selected segment.

4. The method of claim 3, wherein said candidate mathematical expression comprises a polynomial equation.

5. The method of claim 4, wherein and said adjusting comprises at least one among altering one or more coefficients of said polynomial equation and altering an order of said polynomial equation.

6. The method of claim 1, wherein said partitioning comprises:
   identifying one or more segmentation points in said plurality of raw data points; and
   constructing said plurality of segments based on said segmentation points.

7. The method of claim 1, wherein said FOM is at least one among droop, overshoot, rise time, fall time, pulse duration, undershoot, and device output power linearity.

8. The method of claim 1, wherein said characterizing further comprises binning said electronic circuit based on said FOM.

9. An apparatus for evaluating a system, comprising:
   a storage element for receiving at least one time-varying output characteristic of said system, said at least one time-varying output characteristic comprising a plurality of raw data points representing a plurality of measurements at a plurality of times; and
   a processing element communicatively coupled to said storage element, said processing element configured for:
      partitioning said plurality of raw data points into a plurality of segments,
      calculating a plurality of estimated data points based on a plurality of mathematical expressions, wherein at least one of said plurality of mathematical expressions are associated with each of said plurality of segments, and
      characterizing said system based on at least one figure of merit (FOM) computed from said plurality of estimated data points.

10. The apparatus of claim 9, wherein said processing element is further configured during said calculating for:
    generating said plurality of mathematical expressions, each of said plurality of mathematical expressions approximating a behavior of said raw data points in an associated segment of said plurality of segments and satisfying a minimum goodness of fit criteria with respect to said plurality of raw data points in said associated segment.

11. The apparatus of claim 10, wherein said generating further comprises:
    selecting a candidate mathematical expression for a selected segment from said plurality of segments;
    computing said plurality of estimated data points for said selected segment using said candidate mathematical expression;
    evaluating a goodness of fit value between said plurality of estimated data points based on said candidate mathematical expression and said plurality of raw data points in said segment;
    if said goodness of fit value fails to satisfy said minimum goodness of fit criteria, adjusting said candidate mathematical expression and repeating said computing and said evaluating; and
    if said goodness of fit value satisfies said minimum goodness of fit criteria, associating said candidate mathematical expression with said selected segment.

12. The apparatus of claim 11, wherein said candidate mathematical expression comprises a polynomial equation.

13. The apparatus of claim 12, wherein and said adjusting comprises at least one among altering one or more coefficients of said polynomial equation and altering an order of said polynomial equation.

14. The apparatus of claim 9, wherein said processing element is further configured during said partitioning for:
    identifying one or more segmentation points in said plurality of raw data points; and
    constructing said plurality of segments based on said segmentation points.

15. The apparatus of claim 9, wherein said at least one output characteristic received by said storage element comprises at least a portion of one time-varying output signal of an electronic circuit.

16. The apparatus of claim 15, wherein said processing element is further configured to determine at least one among droop, overshoot, rise time, fall time, pulse duration, and undershoot as said quantity computed from said at least one output characteristic.

17. The apparatus of claim 15, wherein said characterizing further comprises binning said electronic circuit based on said FOM.

18. An apparatus for evaluating an electronic device, the apparatus comprising:
 a signal generator/detector for producing at least one input signal for said electronic device and for detecting at least one time-varying output signal from said electronic devices responsive to said input signal, said at least one time-varying output signal comprising a plurality of raw data points representing a plurality of measurements at a plurality of times;
 a storage element for receiving said output characteristic; and
 a processing element communicatively coupled to said storage element, said processing element configured for:
  partitioning said plurality of raw data points into a plurality of segments,
  calculating a plurality of estimated data points based on a plurality of polynomial equations, wherein at least one of said plurality of polynomial equations are associated with each of said plurality of segments, and
  binning said electronic based on at least one figure of merit (FOM) for at least one quantity computed from said plurality of estimated data points.

19. The apparatus of claim 18, wherein said generating further comprises:
 selecting a candidate polynomial equation for a selected segment from said plurality of segments;
 computing said plurality of estimated data points for said selected segment using said candidate polynomial equation;
 evaluating an amount of matching between said plurality of estimated data points based on said candidate polynomial equation and said plurality of raw data points in said segment;
 if said amount of matching fails to satisfy said minimum matching criteria, adjusting said candidate polynomial equation and repeating said computing and said evaluating; and
 if said amount of matching satisfies said minimum matching criteria, utilizing said candidate polynomial as said mathematical expression for said selected segment.

20. The apparatus of claim 18, wherein said processing element is further configured during said partitioning for:
 identifying one or more segmentation points in said plurality of raw data points; and
 constructing said plurality of segments based on said segmentation points.

21. The apparatus of claim 18, wherein said processing element is further configured to determine at least one among droop, overshoot, rise time, fall time, pulse duration, and undershoot as said quantity computed from said output characteristic.

* * * * *